Figure 6:
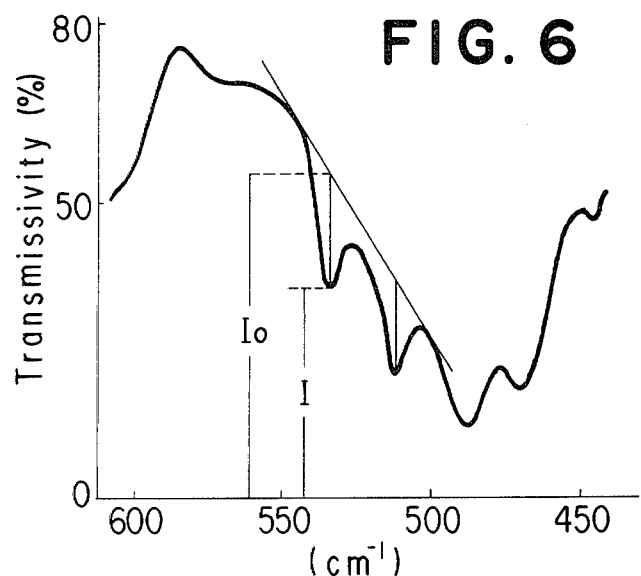

United States Patent [19]

Mizuno et al.

[11] 4,298,719
[45] Nov. 3, 1981

[54] DOUBLY ORIENTED FILM OF POLYVINYLIDENE FLUORIDE

[75] Inventors: Toshiya Mizuno; Mitsuru Ohta; Masahiro Segawa, all of Iwaki, Japan

[73] Assignee: Kureha Kagaku Kogyo Kabushiki Kaisha, Tokyo, Japan

[21] Appl. No.: 58,776

[22] Filed: Jul. 19, 1979

[30] Foreign Application Priority Data

Jul. 27, 1978 [JP] Japan ............................... 53-90965

[51] Int. Cl.³ ................... B32B 27/00; B29C 17/02; H01B 3/44; C08F 14/18
[52] U.S. Cl. .................................... 526/255; 428/421; 428/422; 428/910; 428/461; 264/290.2
[58] Field of Search ................ 252/63, 63.2; 428/421, 428/422, 910; 526/255

[56] References Cited

U.S. PATENT DOCUMENTS

| | | | |
|---|---|---|---|
| 2,774,704 | 12/1956 | Smith | 428/422 |
| 3,616,177 | 10/1971 | Gumerman | 428/422 X |
| 3,878,274 | 4/1975 | Murayama et al. | 526/255 X |
| 3,925,339 | 12/1975 | Ishii et al. | 526/255 |
| 3,931,446 | 1/1976 | Murayama et al. | 428/421 |
| 4,095,020 | 6/1978 | Prest et al. | 428/421 X |
| 4,173,033 | 10/1979 | Sako et al. | 252/63.2 X |
| 4,189,392 | 2/1980 | Penneck et al. | 252/63.2 |
| 4,241,128 | 12/1980 | Wang | 526/255 X |

FOREIGN PATENT DOCUMENTS 2146856 3/1973 France .
1173688 12/1969 United Kingdom .

Primary Examiner—P. C. Ives
Attorney, Agent, or Firm—Wegner & Bretschneider

[57] ABSTRACT

Polyvinylidene fluoride film having its crystalline region occupied predominantly by form I crystals, characterized in that the crystals are substantially double oriented.

5 Claims, 12 Drawing Figures

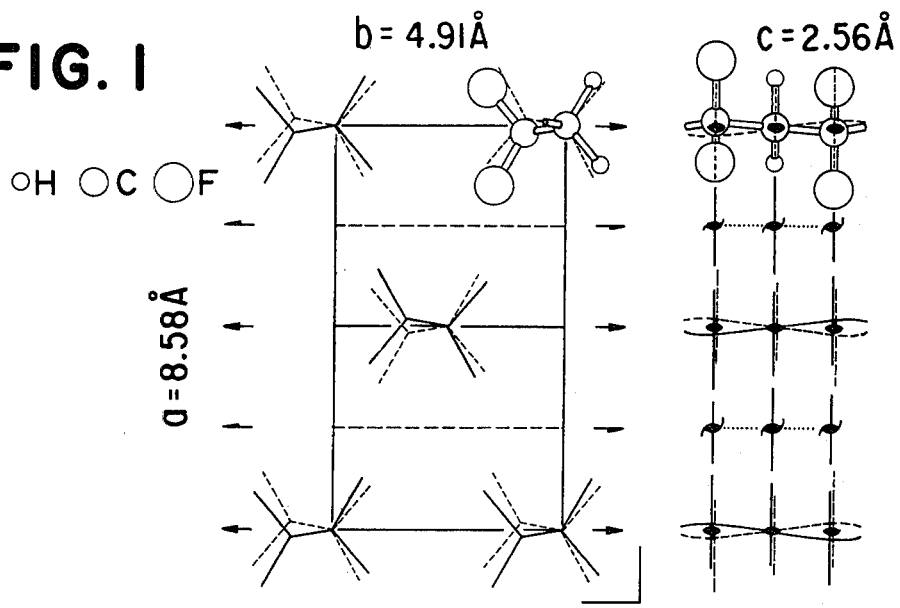
FIG. 1
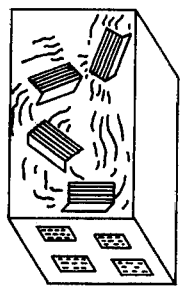
FIG. 4
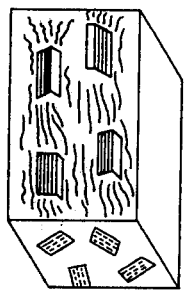
FIG. 3
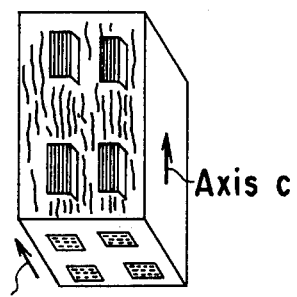
FIG. 2
FIG. 5

DOUBLY ORIENTED FILM OF POLYVINYLIDENE FLUORIDE

The present invention relates to a film of polyvinylidene fluoride (hereinafter referred to as PVDF), and more specifically to a film of PVDF in which crystals thereof are substantially in a doubly oriented state, excellent as the dielectrics.

PVDF has, by its nature, an extremely higher dielectric constant, as compared to other polymers, as well as a high breakdown voltage, a high heat-resistance, a high oil-resistance, and is stable for a long time period and so it is a highly desirable material as a dielectric. For example, PVDF films known so far have a dielectric constant of between 10 to 12 and are usually employed as the dielectric material for smaller sized capacitors. Further, it is known that the PVDF films constitute a unique and useful dielectric material also being piezoelectric and pyroelectric.

Among the above-mentioned characteristics, the electric characteristics of the PVDF film depends very much on the condition of preparation of the film. That is, the crystals of polyvinylidene fluoride in the film of PVDF have any one of the crystal forms of I, II and III depending upon the condition of preparation of the PVDF film and moreover, their orientation also depends upon the condition of preparation of the film. Among the three crystal forms, the form having the excellent characteristics as the dielectric is the form I.

The three crystal forms, I, II and III, are briefly explained as follows based on the reference by Hasegawa et al. (Polymer Journal, Vol. 3, No. 5, pp 600–610 (1972)). Crystal structures of PVDF are explained in detail in the reference cited.

The form I crystal has planary zig-zag molecular chains with the directions of dipoles arranged regularly in one direction and so the film of PVDF composed of the form I crystals is valuable as a dielectric material. The form II crystal has TGTG'-formed molecular chains in which the dipoles are in a state mutually opposite. And the form III crystal is a specific crystal state obtainable by processing under a high pressure and although it resembles the form I crystal it may be neglected at present from the stand point of application.

Films of PVDF are prepared by either of the following two methods:

(1) At first, a solution of PVDF is cast on a flat surface, and then the solvent thereof is evaporated therefrom to leave a film, and (2) At first, a sheet is prepared from PVDF while applying heat, and then the sheet is stretched monoaxially in one direction or further stretched to another direction which is perpendicular to the former direction to produce a biaxially stretched film. Industrially, however, the method (2) is prevalent.

In the method (2), the sheet of PVDF obtained by cooling the melt PVDF contains mainly the form II crystals. By stretching the thus obtained sheet containing the form II crystals at a relatively lower temperature, the form II crystals transform into the form I crystals. In such a case, the orientation of the form I crystals is determined depending upon the conditions of stretching.

By mono-axially stretching the film composed of the form II crystals, the transformed form I crystals become oriented in the surface of the film in the direction of the stretching, however, in the cross section of the film perpendicular to the direction of stretching, the form I crystals are in a random state. On stretching further the monoaxially stretched film to the direction which is perpendicular to the former direction, the form I crystals take a random arrangement in the above-mentioned film surface and are regularly arranged in the cross section of the film thus obtained.

As has been stated, the method of preparing films of PVDF utilizing the process of stretching has hitherto provided the film of PVDF composed mainly of the form I crystals which offer favorable electric characteristics as a dielectric, however, the form I crystals therein are only monoaxially oriented.

The dielectric constant of the monoaxially stretched film of PVDF composed mainly of monoaxially oriented form I crystals or the biaxially stretched film of PVDF (once stretched to a direction and further stretched to the direction perpendicular to the former direction) is in the range of 10 to 13, as large as by 3-4 times that of films made of polyesters. Accordingly, the films of PVDF are utilized as capacitors of medical defibrillators serving for their portabilization, and moreover, even the application to the capacitor for nuclear fusion is under discussion.

However, in cases where the film of PVDF is utilized as an electric material such as dielectric, it is desirable that the crystals of the film of PVDF are the form I crystals and that they are doubly oriented because, it is considered that the doubly oriented form I crystals of PVDF have a more excellent electric characteristics based on their three dimensional anisotropy.

The primary object of the present invention is to provide the films of PVDF substantially composed of the form I crystals oriented biaxially. The second object thereof is to provide excellent films of PVDF as a dielectric.

Following is a more detailed description of the present invention.

In the attached drawings,

FIG. 1 shows the unit cells of the form I crystal of PVDF.

FIGS. 2, 3 and 4 respectively show the modes of orientation of the crystals in the doubly oriented film of the present invention, in the conventional monoaxially stretched film and in the conventional biaxially stretched film in a schematic way.

FIG. 5 shows a melting curve of a sheet of PVDF determined by a differential scanning calorimeter at a rate of temperature rise of 8° C./min. FIG. 6 shows absorbancy in the infrared absorption spectrum of PVDF.

Figure 7:
Figure 8:
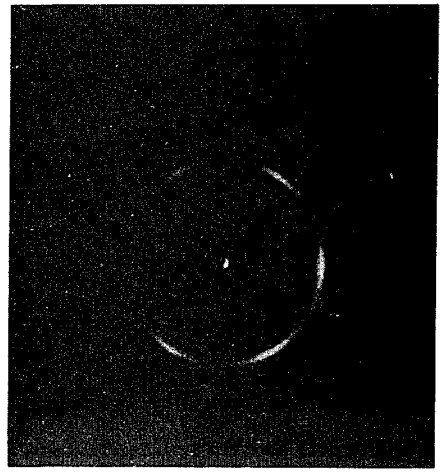
Figure 9:
Figure 10:
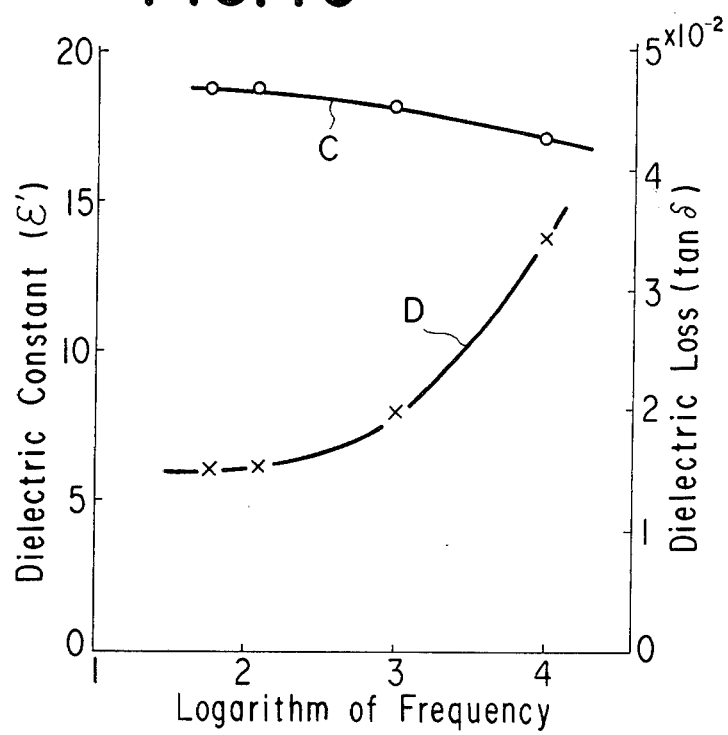
Figure 11:
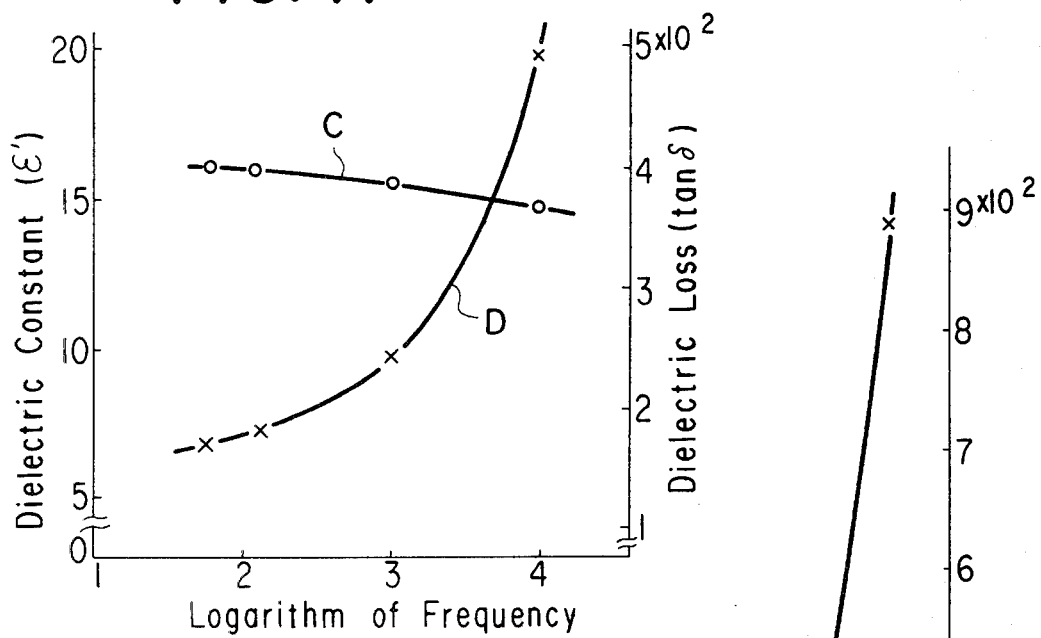
Figure 12:
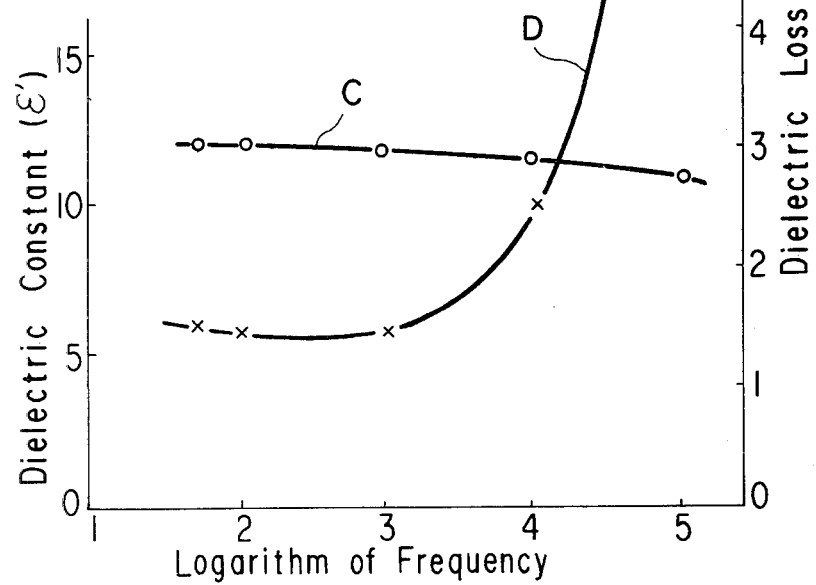

FIGS. 7 and 8 are the photographic representation of the wide-angle X-ray diffraction pattern of the film of the present invention, while FIG. 9 shows that of the conventional film of PVDF. And FIGS. 10, 11 and 12 show the dependencies of the dielectric constant and the dielectric loss of the three typical specimens of PVDF of which the X-ray diffraction patterns are shown in FIGS. 7, 8 and 9, respectively on the frequency. In addition, in FIGS. 10 to 12 the marks C and D denote the dielectric constant and the dielectric loss, respectively.

The films of polyvinylidene fluoride provided by the present invention have their crystal regions mainly occupied by the form I crystals and the form I crystals thereof are substantially double-oriented.

The double orientation of the form I crystals of the present invention is now explained based on the above-mentioned reference by Hasegawa et al. as follows referring to FIGS. 1 and 2.

The three crystal axes of the form I are defined as follows: The direction of the molecular chain of polyvinylidene fluoride is taken as the axis c; the direction perpendicular to the axis c and parallel to the direction of the dipole of the molecule of PVDF is taken as the axis b and the direction perpendicular to the both axes b and c is taken as the axis a, as is seen in FIG. 1.

Following the above-mentioned definition, as is shown in FIG. 2, the orientation of the form I crystals of the film of PDVF of the invention is such that the axis c is oriented to the direction of monoaxial stretching in the surface of the film; the axis b is oriented, in the cross section of the film which is perpendicular to the direction of the monoaxial stretching, to the direction of the second stretching and the axis a is oriented at an angle of 90° to both axes c and b, and so the form I crystals shown in FIG. 2 are doubly oriented.

In the conventional monoaxially stretched film of PVDF, the axis c is oriented to the direction of the stretching when seen from the film surface as is shown in FIG. 3, however, the axes b are random when seen from the cross sectional plane of the film and accordingly the axes a are random. While in the conventional biaxially stretched film of PVDF, as is shown in FIG. 4, the axes c are oriented at random, and when seen from the cross sectional plane of the film, there is a tendency that the axes b are oriented in parallel to the film surface and the axes a are oriented perpendicularly to the film surface.

The method of preparing the doubly oriented film of PVDF is described as follows:

In order to obtain the doubly oriented film of PVDF, it is necessary to fulfill the following four conditions:

(i) A PVDF with a specified inherent viscosity of from 1.0 dl/g, preferably 1.1 dl/g to 1.8 dl/g is to be used as the material, because, in the case where the inherent viscosity of PVDF is less than 1.0 dl/g, the film is apt to be torn on stretching and even if not torn, the axes a and b could not be oriented well, that is, a planar orientation becomes difficult. On the other hand, in the case of higher inherent viscosity than 1.8 dl/g, the PVDF is not easily processable, resulting in difficulty of forming the sheet. Either of the cases are thus not preferable.

The "inherent viscosity", $\eta$ inh, herein referred to is a value derived by the following formula:

$$\eta_{inh} = \frac{1}{C} \ln \frac{\eta}{\eta_o}$$

wherein, $\eta$ is the viscosity of a solution of PVDF in purified dimethylformamide of a concentration of 0.4 g/dl at 30° C., $\eta_o$ is the viscosity of the purified dimethylformamide at 30° C., and C equals to 0.4 g/dl.

In addition, the PVDF referred to in the present invention includes not only the homopolymers of vinylidene fluoride but also the copolymers of vinylidene fluoride with more than one comonomer containing vinylidene fluoride units of more than 80 mole % and polymer compositions comprising either of the homopolymers and copolymers above-mentioned. Comonomers herein utilized are those copolymerizable with vinylidene fluoride such as tetrafluoroethylene, hexafluoropropylene, chlorotrifluoroethylene, vinyl fluoride, hexafluorobutene, etc. already known.

(ii) In the actual case where the PVDF with the specified inherent viscosity as mentioned above is used for the processing and the molten PVDF is cooled to solidify for preparing a sheet-form material for the biaxial stretching, the conditions of cooling affect very much the double-orientability of the form I crystals in the film obtained by the biaxial stretching. According to the invention the double-oriented film of PVDF is obtained by cooling the molten PVDF rapidly. But it is difficult to define the conditions of rapid cooling because it is nearly impossible to determine the temperature of a polymer in the course of cooling, however, the melting behavior of the crystals in a cooled and solidified sheet can be utilized as one of the criteria of the conditions of rapid cooling. The situation is as follows:

Generally, as is shown in FIG. 5, when the solidified polymer of PVDF obtained by cooling the melt polymer is heated again at a rate of temperature rise of 8° C./min by the differential scanning calorimeter (hereinafter referred to as DSC) a smaller peak (hereinafter referred to as the sub-peak A) appears at a temperature about 168° to 170° C. and then a larger peak (hereinafter referred to as the main peak B) appears at a temperature about 175° to 176° C. The sub-peak A shows a remarkable correspondence to the conditions of cooling of the melt PVDF, and it is smaller in size as the cooling is carried out more rapidly.

That is, it has been found by the inventors that the satisfactorily doubly oriented film is obtainable by biaxially stretching a solid sheet which shows a ratio of the height of peak A to the height of peak B of less than 0.6 when melted by heating in DSC. The height of a peak is the length of a perpendicular drawn from the top of the peak to the base line as in FIG. 5, and the above-mentioned ratio of the heights shows the relative strength of the sub-peak A.

Even if a sheet with the ratio of more than 0.6 is stretched under the following conditions, no satisfactory doubly oriented film is obtained.

(iii) Moreover, in order to prepare a doubly oriented film of PVDF, it is necessary at first to carry out the first monoaxial stretching of the sheet which fulfills the above-mentioned conditions (i) and (ii), at a temperature of 50° to 170° C. to the degree of completing the necking stretching, at a stretching ratio, as small as possible, of 3 to 6, and then to carry out the second monoaxial stretching of the monoaxially stretched film in the direction perpendicular to that of the first stretching, at a stretching ratio of more than 3 and lower than the limit of the elongation at break, preferably 4 to 8 at a temperature of 80° to 150° C.

The conventional PVDF film mainly composed of form I crystals may be prepared by only taking into account the temperature on stretching, that is, the film rich with the form I crystals could have been prepared by either monoaxially stretching any sheet PVDF at a temperature of lower than 120° C. or further monoaxially stretching the film prepared through the monoaxial stretching at a temperature lower than 170° C., under the conditions that the direction of second stretching is perpendicular to the direction of the first stretching and the temperature of the second stretching is lower than 150° C. However, the film in which the axes b and c of form I crystals of PVDF are oriented in parallel with the plane of the film, that is the so-called doubly oriented film, is not obtainable by stretching under this conventional conditions of stretching without the above-mentioned conditions (i) and (ii).

(iv) Furthermore, in the case where the second stretching is carried out at a temperature within the above-mentioned range after carrying out the first stretching at a temperature within the above-mentioned range, it is necessary that the temperature difference between the first and the second stretchings is less than 60° C.

In the case where the difference is more than 60° C., the film is apt to be torn during the second stretching resulting in difficulty in continued operation. Even when partially stretched, the film whitens not to a film in which the axes b are substantially oriented in the film plane.

Such a distinction between the form I crystal and the form II crystal, and the evaluation of the degree of double orientation, can be carried out by infrared absorption spectroscopy and wide-angle X-ray diffraction photography. The methods of the distinction and evaluation are explained in detail as follows:

In order to see whether the form I crystal is the main component of the crystalline system of PVDF, the method of infrared absorption spectroscopy which has been used for a long time is utilized. That is, the absorbancy $D_{510}$ due to the form I crystal and the absorbancy $D_{530}$ due to the form II crystal are obtained by setting a base line as is shown in FIG. 6 (although FIG. 6 shows the transmissibility, the absorbancy is taken as the reciprocal of the transmissibility), and then the proportion of the form I crystal in the whole crystalline system of PVDF is obtained by the following formula:

$$\text{Proportion (\%) of the form I crystals in a given crystalline system} = \frac{D_{510}}{D_{510} + D_{530}} \times 100$$

In order to obtain the above-mentioned doubly oriented structure of PVDF, it is necessary to have the above-mentioned proportion of larger than 65%, preferably larger than 75%.

The evaluation of the mode of orientation of the crystals is carried out by wide angle X-ray diffraction photography. The photograph is taken by the incident $CuK_\alpha$ X-ray perpendicular to the cross section of the film specimen which is set with its width vertical, the film specimen being cut from the film to a direction perpendicular to the direction of the second stretching. The criterion of the mode of orientation of the crystals is whether the diffraction patterns of the planes (2 0 0) and (1 1 0) becomes 6 point-like images, 6 arc-like images, or ring-form. Those specimens which show 6 point-like or 6 arc-like images are judged to have their axes b in the film oriented substantially parallel to the plane of the film, from which the specimen is taken, not having their axes a and b oriented in random in the cross section of the film.

Wide-angle X-ray diffraction photographs of the typical examples of the present invention are shown in FIGS. 7 and 8. As is seen a 6 spot-like pattern appears in FIG. 7, and a 6 arc-like pattern appears in FIG. 8.

The larger the degree of parallel orientation of all the axes b of the form I crystals to the film plane, the sharper becomes 6 spot-like pattern, becoming substantially spottish. However, the more insufficient the orientation of the axes b of the form I crystals with approximately parallelism, the more dim grow the pattern, and become 6 arc-like spots such as those in FIG. 8. Moreover, in the case where the axes a and b are oriented at random in the cross section of the film, a ring-like pattern such as that seen in FIG. 9 is observed.

The present invention includes even the films which give a little obscure X-ray pattern with 6 arc-like images such as those seen in FIG. 8, that is, the films in which the axes b are approximately parallel to the film plane are regarded as those in which the axes b are substantially oriented parallel to the film plane.

Even in FIG. 8, the diffraction pattern is observed as a ring-like image by careless eyes; however, the strength of diffraction of the arc-like images on the equator due to plane (2 0 0) and that of the other arc-like images due to plane (1 1 0) are clearly larger than those of the neighbouring background; whereas in the cases such as FIG. 9, the strength of diffraction cannot be recognized to be larger than that of the neighbourings. Accordingly, the distinction between those represented by FIG. 8 and those represented by FIG. 9 is clearly recognizable.

In the next place, it is shown that the above-mentioned doubly oriented film of PVDF according to this invention is excellent as a dielectric. The film having the doubly oriented structure of PVDF shows, for instance, as is seen in FIG. 10, a dielectric constant of 18.5 and a dielectric loss of 1 to 2% at 120 Hz and at a temperature of 25°±2° C. When these values are compared to a dielectric constant of 7 to 13 at 120 Hz and a dielectric loss of 1-5% of the well known PVDF film (without having double orientation), it will be understood that the dielectric constant of the film of the present invention is far larger than that hitherto presumed, and that the dielectric loss is the same or smaller as compared to those hitherto presumed.

The film of PVDF of the present invention is not only excellent in the dielectric properties but also remarkably excellent in the insulating properties. For instance, as a result of maintaining a specimen of the film of PVDF of the present invention under the DC 1200 kV/cm for one hour at a temperature of 120° C., no dielectric breakdown has been experienced, the result being taken to confirm the resistivity of the material against high voltages.

The film of the present invention is provided with a high oil resistivity, high thermal stability and high durability for a long time as well as a high voltage at insulation breakdown, and accordingly, it is an excellent material as a dielectric material for capacitors or the like.

Moreover, it is natural that the dielectric material of the present invention is not only suitable for applying to the material for condensers but also is suitable for applying to the dielectric material for several functional elements because it is piezoelectric to dynamic deformation, electrostrictive and pyroelectric.

The followings are the more detailed explanation of the present invention referring to the non-limiting Examples.

EXAMPLE 1

A homopolymer of vinylidene fluoride of an inherent viscosity of 1.35 dl/g was melt-pressed at a temperature of 260° C. under a pressure of 100 kg/cm² to a sheet 0.5 mm in thickness and the sheet was immersed at once into water at a temperature of about 25° C. The thus formed sheet showed a ratio of A/B (ratio of the height of sub-peak A to the height of main peak B) of 0.50. A tablet-shaped specimen of the sheet 80 mm in width was set to a tension tester provided with a heating box, at the test span of 50 mm, and it was stretched at a tensile rate of 10 mm/min and a temperature of 100° C. by four times of its original test length. After completion of the first stretching, it was air-cooled by an electric fan. A specimen was taken from the thus air-cooled and monoaxially stretched sheet, 110 mm in width in the direction perpendicular to the direction of the first stretching and it was stretched at a test length of 20 mm and a tensile rate of 10 mm/min to the direction perpendicular to the direction of the first stretching by 6 times of its original test length of the second stretching while air-cooling by an electric fan as in the first stretching.

The proportion of the form I crystals in the crystalline system in the biaxially stretched film thus obtained was 95%. X-ray diffraction pattern of the thus prepared film taken by photograph with an incident X-ray in the direction parallel to the direction of the second stretching is shown in FIG. 7.

In FIG. 7, the direction from the top to the bottom is perpendicular to the film plane.

Further, after vacuum-coating by aluminum vaporization on the both surfaces of the biaxially stretched specimen of the film of PVDF to be electrodes, the dielectric behaviour of the specimen was determined with a wide range dielectric loss detector at a temperature of 25°±2° C. The result is shown in FIG. 10.

In FIG. 10, the abscissa represents the frequency taken by logaritum, and the ordinate represents the dielectric constant ($\epsilon'$) and the dielectric loss (tan $\delta$), respectively of the specimen. In addition, the dielectric constant, $\epsilon'$, of the biaxially stretched film in this Example was 18.0 at 120 Hz.

EXAMPLE 2

A biaxially stretched film was prepared by at first stretching the press sheet of PVDF prepared in Example 1 by 5 times of the original length at a temperature of 170° C. and then at the second time stretching the above-mentioned monoaxially stretched film by 6 times of the monoaxially stretched film at a temperature of 120° C., the two directions being perpendicular to each other. The proportion of the form I crystals in the crystalline system of the specimen was 78%. FIG. 11 shows the dielectric behaviours of the thus biaxially stretched film of PVDF. FIG. 8 shows a wide angle X-ray diffraction pattern taken by photography of the incident X-ray parallel to the direction of the second stretching. In the figure, the direction from the top to the bottom is perpendicular to the film surface. When FIG. 8 is compared with FIG. 7 of Example 1, it is recognized that the orientation of the axes a and b of FIG. 8 is not so sufficient as that of FIG. 7, resulting the smaller dielectric constant and a little larger dielectric loss than those in Example 1.

EXAMPLE 3 AND COMPARATIVE EXAMPLE 1

A series of biaxially stretched films were prepared by at first stretching the press sheet of PVDF prepared in Example 1 and then stretching to the direction perpendicular to the first direction, under several conditions of temperature at stretching shown in Table 3, however, while not changing the ratio of stretching on both stretchings. The physical properties of the biaxially stretched films prepared as above, however, within the temperature range at stretching included in the scope of the present invention, are shown in Table 3 as Examples 3-1, 3-2, 3-3, 3-4 and 3-5. However, those of the biaxially stretched films prepared by stretching two times at two temperatures not in the range of the scope of the present invention are also shown in Table 3 as Comparative Examples 1-1 and 1-2. Physical properties of the only monoaxially stretched sheet are shown as Comparative Examples 1-3 and 1-4.

TABLE 1

| | Physical properties of biaxially Stretched Film of PVDF | | | | | |
|---|---|---|---|---|---|---|
| | Temperature at stretching (°C.) | | Dielectric constant (120Hz,25° C.) | Dielectric loss (120Hz,25° C.) | Sharpness of X-ray diffraction | Proportion of form I crystals | |
| Example | first | second | ($\epsilon'$) | (tan $\delta \times 10^{-2}$) | images | (%) | Appearance |
| Ex.3-1 | 55 | 110 | 17.5 | 1.2 | I* | 95 | clear and favorable |
| Ex.3-2 | 75 | 110 | 18.1 | 1.2 | I* | 95 | clear and favorable |
| Ex.3-3 | 130 | 120 | 17.0 | 1.4 | II* | 80 | clear and favorable |
| Ex.3-4 | 150 | 120 | 16.3 | 1.5 | II* | 80 | clear and favorable |
| Ex.3-5 | 100 | 150 | 15.0 | 1.5 | III* | 75 | clear and favorable |
| Comparative Ex. 1-1 | 170 | 100 | 12.1 | 1.5 | Planar orientation of form II crystal | 35 | clear and favorable |
| Comparative Ex. 1-2 | 170 | 100 | 13.4 | 1.4 | IV* | 90 | whitened film not usable |
| Comparative Ex. 1-3 | 170 | — | 9.7 | 1.4 | Ring-form resembled to FIG. 9 | 20 | monoaxially stretched sheet |
| Comparative Ex. 1-4 | 100 | — | 13.2 | 1.3 | Same as above | 90 | same as above |

TABLE 1-continued

Physical properties of biaxially Stretched Film of PVDF

| Example | Temperature at stretching (°C.) first | Temperature at stretching (°C.) second | Dielectric constant (120Hz,25° C.) ($\epsilon'$) | Dielectric loss (120Hz,25° C.) ($\tan \delta \times 10^{-2}$) | Sharpness of X-ray diffraction images | Proportion of form I crystals (%) | Appearance |
|---|---|---|---|---|---|---|---|
| 1-4 | | | | | | | |

Notes:
*I: as sharp as those in FIG. 7.
II: between those in FIG. 7 and those in FIG. 8.
III: approximately the same as those in FIG. 8.
IV: between those in FIG. 8 and those in FIG. 9.

EXAMPLE 4

The same homopolymer as in Example 1 was melt-pressed at 260° C. under a pressure of 100 kg/cm² to a hot pressed sheet 0.5 mm in thickness and it was rapidly immersed into iced water at 7° to 9° C. to be cooled. The ratio A/B (loc. cit.) of the thus obtained press sheet was 0.45 (determined by DSC). After stretching the press sheet twice, biaxially in total, under the same conditions as in Example 1, a biaxially oriented film showing a dielectric constant of 18.5, and a dielectric loss of $1.3 \times 10^{-2}$ determined at 25°±2° C. and at 120 Hz was obtained.

The sharpness of the X-ray diffraction pattern of the thus obtained film taken by the same method in Example 1 was about the same as that in FIG. 7 of Example 1. The proportion of the form I crystals in the crystal system was nearly 95%.

EXAMPLE 5

The same homopolymer as in Example 1 was melt-pressed under the same conditions as in Example 1 and the thus obtained hot sheet was rapidly cooled while maintained between the upper and lower press plates of a cooling press at a temperature of about 40° C. The ratio A/B of the thus obtained press sheet was 0.52. The sheet was stretched two times successively to one direction and then to another direction which is perpendicular to the former direction as in Example 1 for accomplishing the successive biaxial stretching. The thus biaxially stretched film showed a dielectric constant of 17.0 and a dielectric loss of $1.2 \times 10^{-2}$ at 25°±2° C. and at 120 Hz. The sharpness of the X-diffraction pattern determined by the same method as in Example 1 was substantially the same as that of FIG. 7. The proportion of the form I crystals in the crystal system was about 90%.

EXAMPLE 6 AND COMPARATIVE EXAMPLE 2

A homopolymer of PVDF with an inherent viscosity of 1.10 dl/g was extruded by an extruder using a T-die 590 mm in width to be a wound sheet about 0.15 mm thickness at a die-temperature of 270° C. and a winding speed of 2.0 m/min. with a cooling roller at a temperature of 70° C. The ratio A/B of the wound sheet of PVDF was 0.55. A biaxially stretched film was prepared by successively stretching the thus extruded and cooled sheet at first to a direction and then to another direction perpendicular to the former direction in a manner as in Example 1. The dielectric constant and the dielectric loss of the thus obtained film were 15.5 and $1.5 \times 10^{-2}$, respectively (by the same method as in Example 4). The sharpness of its X-ray diffraction pattern was between those in FIG. 7 and FIG. 8. The proportion of the form I crystal in the crystalline system was about 90%.

In another experiment (Comparative Example 2), the same homopolymer was extruded under approximately the same conditions as mentioned above, however, using the cooling roll at a temperature of 130° C., to obtain a press sheet with a ratio A/B of 0.80.

A biaxially stretched film was prepared using the thus obtained sheet, under the same conditions as in Example 6. The dielectric constant and the dielectric loss of the thus obtained film were 14.5 and $1.3 \times 10^{-2}$, respectively under the same conditions of determination as in Example 6. The sharpness of its X-ray diffraction pattern was between those in FIGS. 8 and 9, revealing the unsatisfactory orientation of the axes b. The proportion of the form I crystals in the crystalline system was about 90%.

EXAMPLE 7

A copolymer of vinylidene fluoride and chrolotrifluoroethylene having a composition of vinylidene fluoride of 97 mole % and an inherent viscosity of 1.1 dl/g was processed to be a press sheet in a manner as in Example 1. The biaxially stretched film was prepared under the same conditions as in Example 1 from the thus obtained sheet. The dielectric constant and the dielectric loss of the film of the copolymer were 18.5 and $1.5 \times 10^{-2}$, respectively at 25°±2° C., and 120 Hz. The proportion of the form I crystals was over 98%. The X-ray diffraction pattern of the film was nearly same as FIG. 7.

EXAMPLE 8

The biaxially stretched film of PVDF obtained in Example 1 was coated with aluminum by vacuum-evaporation method on both surface as in the case of determining the dielectric constant. A DC 800 kv/cm was applied on the film at 140° C. for 30 min without insulation breakdown, showing its voltage resistivity. Even at DC 1400 kv/cm at 90° C., no insulation breakdown occurred for one hour. From these results it is verified that the film of the present invention is excellent in enduring against high voltage and also excellent as a material for condensers.

What is claimed is:

1. A biaxially stretched film of polyvinylidene fluoride having a crystal region which is predominantly occupied by doubly oriented form I crystals.

2. A film according to claim 1 wherein said form I crystals of polyvinylidene fluoride occupy more than 65% of said crystal region of said film.

3. A film according to claim 1 wherein said polyvinylidene fluoride is a homopolymer of vinylidene fluoride or a copolymer of vinylidene fluoride with a comonomer selected from the group consisting of tetrafluoroethylene, hexafluoropropylene, chlorotrifluoroethylene, vinyl fluoride and hexafluorobutene having more than 80% by weight of vinylidene fluoride units in said copolymer.

4. A film according to claim 1 wherein said form I crystals of polyvinylidene fluoride occupy more than 75% of said crystal region of said film.

5. The biaxially stretched film of claim 1 wherein said crystal region contains six point-images or six arc-images of said form I crystals in a wide angle x-ray diffraction pattern of the (200) plane and the (110) plane on the incidence of $CuK_\alpha$ x-ray perpendicular to the cross-section of said film crossing the axis of the second axial stretching at right angles.

* * * * *